(12) United States Patent
Chang et al.

(10) Patent No.: US 11,664,390 B2
(45) Date of Patent: May 30, 2023

(54) FLEXIBLE ELECTRONIC DEVICE

(71) Applicant: InnoLux Corporation, Miao-Li County (TW)

(72) Inventors: Ti-Chung Chang, Miao-Li County (TW); Chih-Chieh Wang, Miao-Li County (TW); Chien-Chih Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 14 days.

(21) Appl. No.: 17/109,263

(22) Filed: Dec. 2, 2020

(65) Prior Publication Data
US 2021/0082970 A1 Mar. 18, 2021

Related U.S. Application Data

(63) Continuation of application No. 16/390,402, filed on Apr. 22, 2019, now Pat. No. 10,886,307.

(60) Provisional application No. 62/673,212, filed on May 18, 2018.

(30) Foreign Application Priority Data

Oct. 15, 2018 (CN) .......................... 201811196586.8

(51) Int. Cl.
| | |
|---|---|
| *H01L 27/12* | (2006.01) |
| *H01L 23/498* | (2006.01) |
| *H10K 77/10* | (2023.01) |
| *H10K 102/00* | (2023.01) |
| *H01L 51/00* | (2006.01) |

(52) U.S. Cl.
CPC ...... *H01L 27/1244* (2013.01); *H01L 23/4985* (2013.01); *H01L 27/1218* (2013.01); *H01L 27/1262* (2013.01); *H01L 51/0097* (2013.01); *H01L 2251/5338* (2013.01)

(58) Field of Classification Search
CPC ..... H01L 27/124–1244; H01L 27/1218; H01L 23/4985; H01L 51/0097; H01L 2251/5338; H01L 27/1262
See application file for complete search history.

(56) References Cited

U.S. PATENT DOCUMENTS

| | | | |
|---|---|---|---|
| 2016/0035759 A1* | 2/2016 | Kwon ................. | H01L 27/1225 438/151 |
| 2019/0081257 A1* | 3/2019 | Kim .................... | H01L 27/1218 |

FOREIGN PATENT DOCUMENTS

CN        107170374 A        9/2017

OTHER PUBLICATIONS

Chinese language office action dated Dec. 4, 2020, issued in application No. CN 201811196586.8.

* cited by examiner

*Primary Examiner* — Sonya McCall-Shepard
(74) *Attorney, Agent, or Firm* — McClure, Qualey & Rodack, LLP

(57) ABSTRACT

An electronic device is provided. The electronic device includes a supporting substrate, a flexible substrate disposed on the supporting substrate, a first conductive layer disposed on the flexible substrate, a second conductive layer disposed on the first conductive layer, a plurality of organic elements disposed between the first conductive layer and the second conductive layer, and an opening passing through the supporting substrate and exposing a portion of the flexible substrate. The first conductive layer alternately contacts the second conductive layer and the plurality of organic elements.

11 Claims, 12 Drawing Sheets

FLEXIBLE ELECTRONIC DEVICE

CROSS-REFERENCE TO RELATED APPLICATIONS

This application is a continuation of application Ser. No. 16/390,402, filed on Apr. 22, 2019, which claims priority to U.S. Provisional Patent Application No. 62/673,212, filed on May 18, 2018, and China Patent Application No. 201811196586.8 filed on Oct. 15, 2018, which are incorporated by reference herein in their entirety.

BACKGROUND

Field

The disclosure relates to an electronic device, and more particularly to a flexible electronic device.

Description of the Related Art

In general, a display area is surrounded by a frame area without a display function, and driving elements and wiring layers are disposed in the frame area. However, the frame area will limit the available space of a screen, so it is desired to minimize the frame area to achieve the greatest screen space. Furthermore, conventional flexible electronic devices also have a problem wherein wiring in the electronic devices may break if the flexible electronic device is bent too many times or the radius of curvature of the flexible electronic device during bending is too low, which reduces the reliability of the conventional flexible electronic devices.

SUMMARY

The present disclosure is related to an electronic device with a display area and a non-display area. The electronic device includes a supporting substrate, a flexible substrate, a first organic insulating layer, a first conductive layer, a second conductive layer, a second organic insulating layer, and a resilient structure. The flexible substrate is disposed on the supporting substrate. The first organic insulating layer is disposed on the flexible substrate. The first conductive layer is disposed on the first organic insulating layer. The second conductive layer is disposed on the first conductive layer. The second organic insulating layer is disposed on the second conductive layer. The resilient structure includes resilient elements disposed between the first conductive layer and the second conductive layer. The first organic insulating layer, the second organic insulating layer, the first conductive layer, the second conductive layer and the resilient structure are disposed on the non-display area, and the first conductive layer alternately contacts the second conductive layer and the resilient elements.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
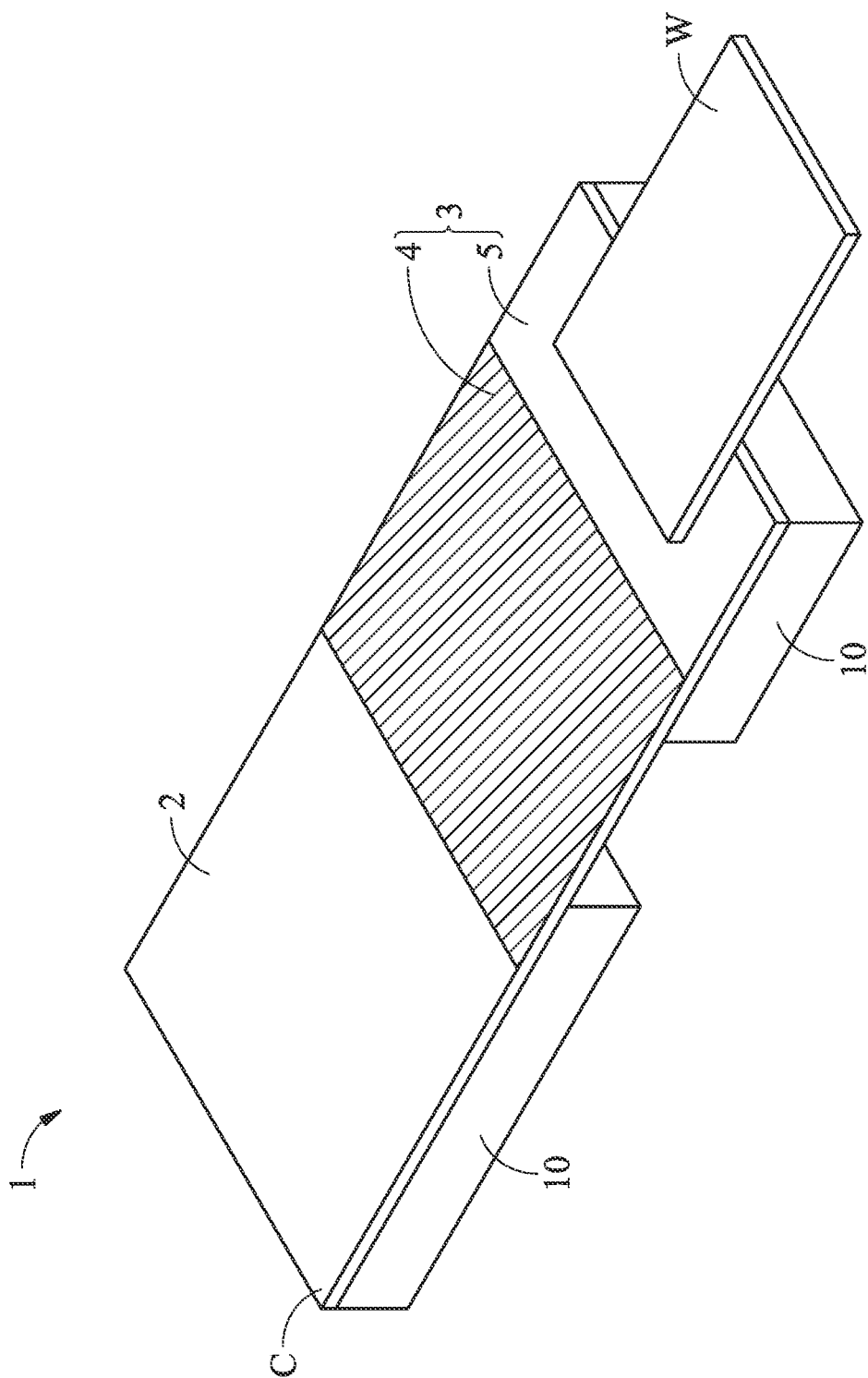
FIG. 1 is a schematic view of an electronic device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, that the features may not be in direct contact. In addition, spatially relative terms, for example, "vertical," "above," "over," "below,", "bottom," etc. as well as derivatives thereof (e.g., "downwardly," "upwardly," etc.) are used for ease of the present disclosure of one features relationship to another feature. The spatially relative terms are intended to cover different orientations of the device including the features.

FIG. 1 is a schematic view of an electronic device 1 according to an embodiment of the present disclosure. In this embodiment, the electronic device 1 includes a display area 2 and a non-display area 3. The non-display area 3 includes a bending area 4 and a wiring area 5, wherein the border between the display area 2 and the bending area 4 and the border between the bending area 4 and the wiring area 5 may be further defined later. In this embodiment, a wiring W is disposed on the wiring area 5 for connecting to other devices (not shown). In some embodiments, the wiring W maybe, but not limited to, chip on film (COF), flexible printed circuit (FPC), or printed circuit hoard (PCB).

The electronic device 1 is mainly formed from a supporting substrate 10 and an electronic device C on the supporting substrate 10. The supporting substrate 10 is disposed in the display area 2, in the wiring area 5, and in a portion of the bending area 4. For example, as shown in FIG. 1, there is a portion of the bending area 4 that no supporting substrate 10 is disposed therein. In other words, a portion of the supporting substrate 10 on the bending area 4 is removed. In some embodiments, the supporting substrate 10 is disposed in the display area 2 rather than the wiring area 5.

The electronic device 1 may be, for example, a display device including liquid crystal (LC), organic light-emitting diode (OLED), quantum dot (OD), fluorescent material, phosphor material, light-emitting diode (LED), mini light-emitting diode (Mini LED), micro light-emitting diode (Micro LED) or other display medias, but the present disclosure is not limited there: The electronic device may also be, for example, a sensing device, an antenna, a combination thereof, or a combined electronic device by combining multiple electronic devices.

Figure 2A:
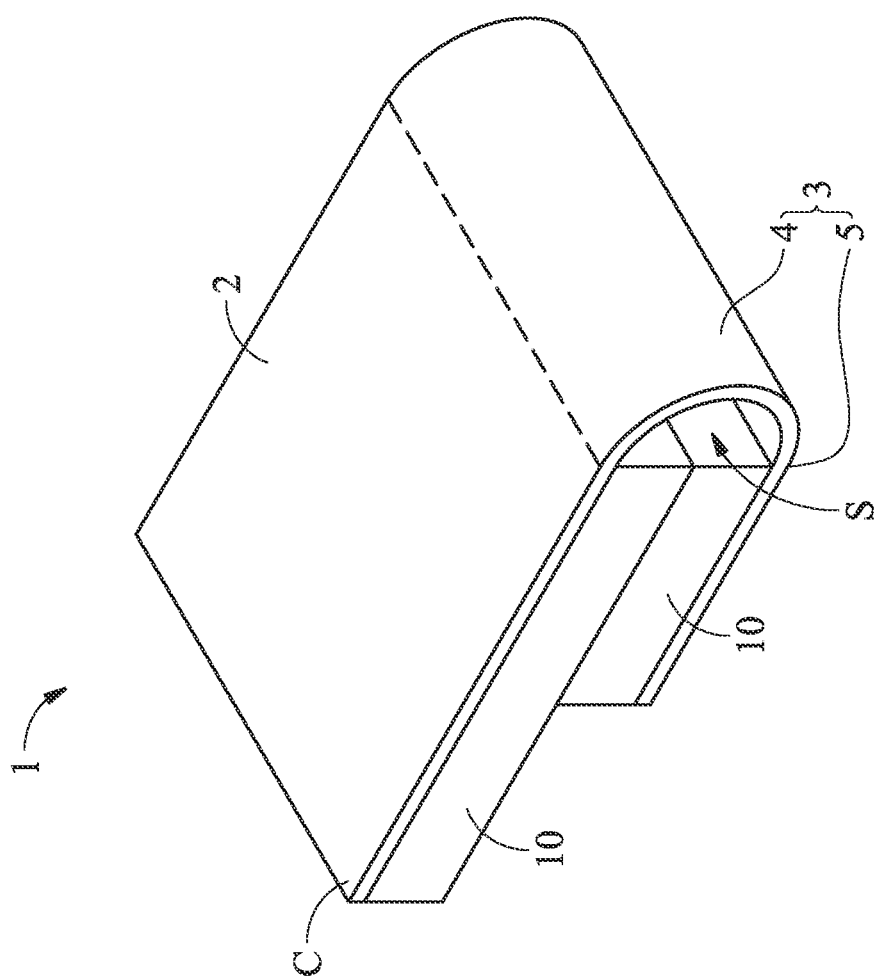
FIG. 2A is a schematic view of an electronic device under a bending condition according to an embodiment of the present disclosure.

FIG. 2A is a schematic view of the electronic device 1 under a bending condition according to an embodiment of the present disclosure. In FIG. 2A, the non-display area 3 is bent toward a backside of the display area 2 (a surface adjacent to the supporting substrate 10), wherein the bending area 4 of the non-display area 3 is bent to have an arc-liked shape, and a space S is formed between the bending area 4 and the supporting substrate 10. The supporting substrate 10 on the display area 2 and the wiring area 5 may overlap or contact with each other. As a result, when viewed from a front surface of the display area 2 (a surface away from the supporting substrate 10), the wiring area 5 without a display function may be hided at the back side of the display area 2 to increase the area occupied by of the display area 2 or enhance the freedom of wiring, so as to be a means for producing an electronic device having a narrow frame or a combined electronic device with a narrow gap.

Figure 2B:
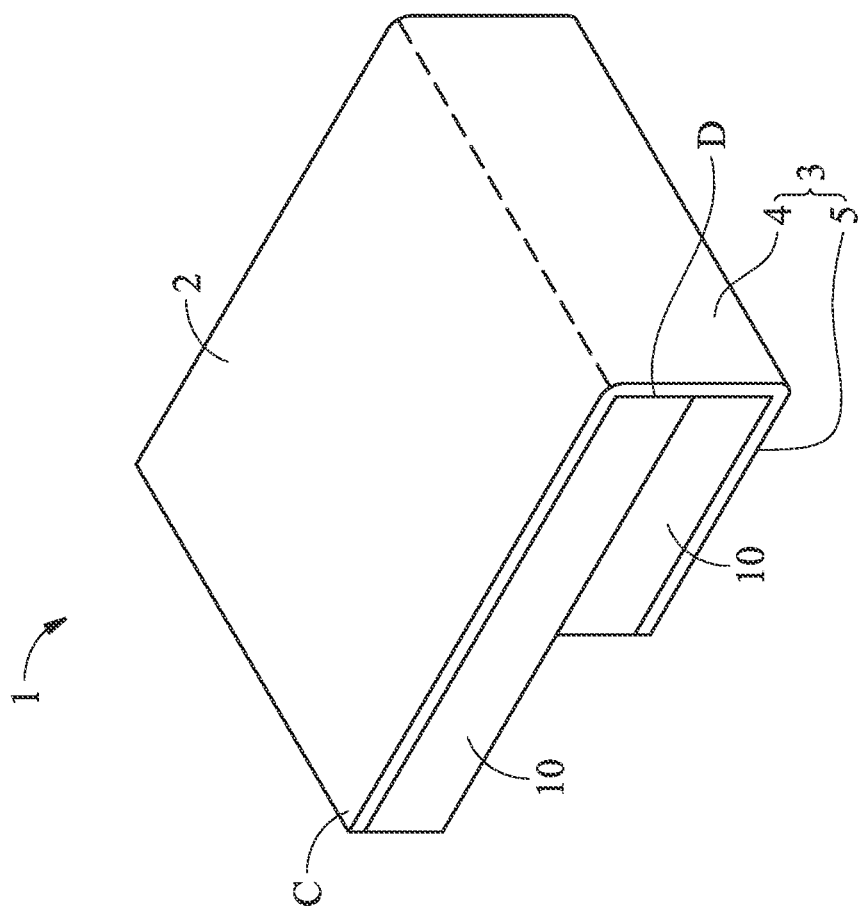
FIG. 2B is a schematic view of an electronic device under another bending condition according to an embodiment of the present disclosure.

FIG. 2B is a schematic view of the electronic device 1 under a bending condition according to another embodiment of the present disclosure. In FIG. 2B, the bending area 4 is bent toward a side of the supporting substrate 10 to approach or contact the side of the supporting substrate 10 (as shown by an interface D), an angle between the display area 2 and a portion of the bending area 4 positioned on the side of the supporting substrate 10 is about 90 degrees, and an angle between the wiring area 5 and the portion of the bending area 4 positioned on the side of the supporting substrate 10 is also about 90 degrees. The portions of the supporting substrate 10 on the display area 2 and the wiring area 5 may overlap or contact with each other. As a result, when viewed from a front surface of the display area 2 (the surface away from the supporting substrate 10), the wiring area 5 without a display function may be hided at the back side of the display area 2 to increase the area occupied by the display area 2. Furthermore, because the angle between the display area 2 and a portion of the bending area 4 positioned on the side of the supporting substrate 10 and the angle between the wiring area 5 and the portion of the bending area 4 positioned on the side of the supporting substrate 10 are about 90 degrees, the area occupied by the display area 2 when viewed from the front surface of the display area 2 may be further increased, the freedom of wiring may be enhanced, or the area occupied by the electronic device C at a gap formed during combination may be reduced, so as to be a means for producing an electronic device having a narrow frame or a combined electronic device with a narrow gap.

Figure 3A:
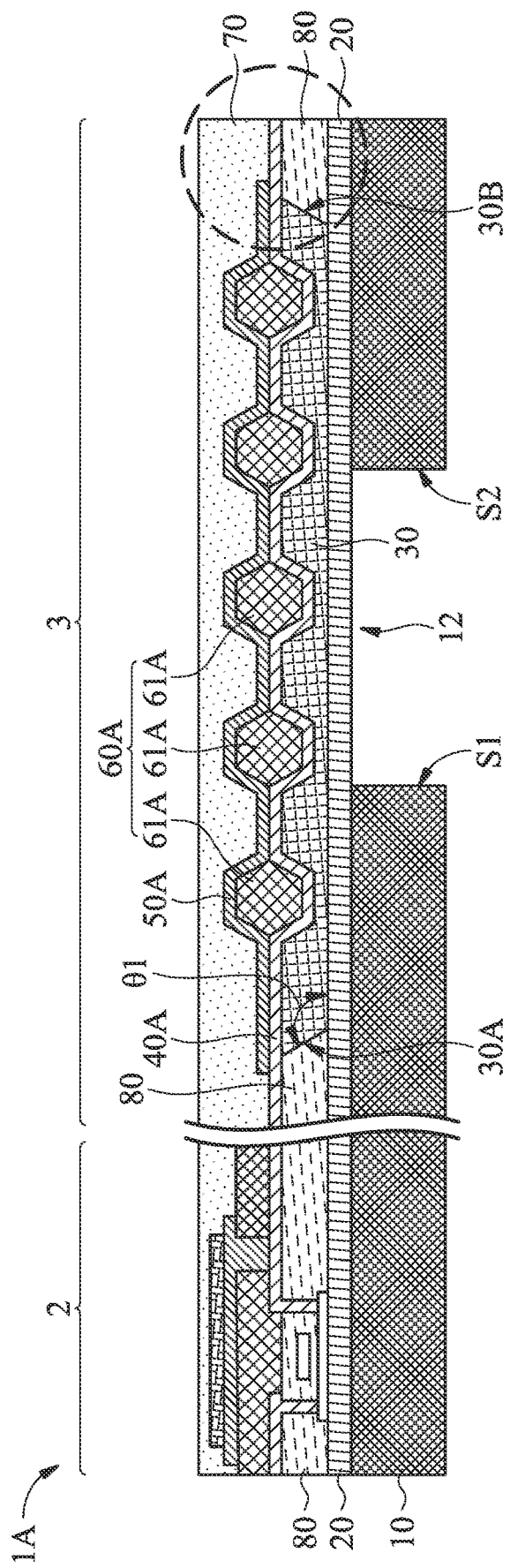
FIG. 3A is a cross-sectional view of an electronic device according to an embodiment of the present disclosure.

FIG. 3A is a cross-sectional view of an electronic device 1A according to an embodiment of the present disclosure. In FIG. 3A, the electronic device 1A includes a supporting substrate 10, a flexible substrate 20, a first organic insulating layer 30, a first conductive layer 40A, a second conductive layer 50A, a resilient structure 60A, a second organic insulating layer 70 and an inorganic insulating layer 80.

The flexible substrate 20 is disposed on the supporting substrate 10, an opening 12 is formed on the non-display area 3, wherein the supporting substrate 10 is penetrated by and separated as two portions by the opening 12. Furthermore, a portion of the flexible substrate 20 is exposed by the opening 12. In an embodiment, the supporting substrate 10 terminates at the opening 12 and has two sides S1, S2 exposed by the opening 12, and a space S is formed between the two sides S1, S2 and the flexible substrate 20 when the electronic device 1A is bent as shown in FIG. 2A, In another embodiment, the two sides S1, S2 directly contact the flexible substrate 20 when the electronic device 1A is bent. In some embodiments, the supporting substrate 10 terminates at the opening 12 and is not separated into two portions by the opening 12. The first organic insulating layer 30 and the inorganic insulating layer 80 are disposed on the flexible substrate 20, and the thickness of the first organic insulating layer 30 and the thickness of the inorganic insulating layer 80 are substantially the same. An interface 30A and an interface 30B are formed between the first organic insulating layer 30 and the inorganic insulating layer 80, and the angle formed between the interface 30A or the interface 30B to the flexible substrate 20 is θ1. In some embodiments of the present disclosure, the angle θ1 is greater than 90 degrees and less than 180 degrees, but the present disclosure is not limited thereto. The interface 30A and the interface SOB between the first organic insulating layer 30 and the inorganic insulating layer 80 are the interface between the display area 2 and the bending area 4 and the interface between the bending area 4 and the wiring area 5, respectively. If the interface 30A or the interface 30B is tilted, where the flexible substrate 20 and the interface 30A or the interface 30B contacts with each other may act as a border of different areas. The interface 30A or the interface 30B between the supporting substrate 10. In other words, the interface 30A or the interface 30B between the first organic insulating layer 30 and the inorganic insulating layer 80 overlaps the supporting substrate 10 when viewed along a direction perpendicular to a surface of the flexible substrate 20. The chance of the interface 30A or the interface 30B being stripped due to withstanding bending stress may be reduced if the interface 30A or the interface 30B is moved inwardly a certain distance from the border of the supporting substrate 10 so as to increase the reliability of the electronic device 1A. Therefore, a distance between two sides S1, S2 of the supporting substrate 10 is less than a distance between the two interfaces 30A, 30B. In the present disclosure, the direction perpendicular to the flexible substrate 20 is defined as the normal direction of a surface of the flexible substrate 20, and other elements are disposed on the surface.

The first conductive layer 40A is disposed on the first organic insulating layer 30 and the inorganic insulating layer 80, and the second conductive layer 50A is disposed on the first conductive layer 40A. The resilient structure 60A includes a plurality of resilient elements 61A disposed between the first conductive layer 40A and the second conductive layer 50A, and the second organic insulating layer 70 is disposed on the second conductive layer 50A. The first organic insulating layer 30, the first conductive layer 40A, the second conductive layer 50A, the resilient structure 60A and the second organic insulating layer 70 are disposed in the non-display area 3. In this embodiment, the first conductive layer 40A is electrically connected to an active driving device disposed in the display area 2 or the non-display area 3. The resilient elements 61A may include suitable organic materials.

The supporting substrate 10 is used for supporting the whole electronic device 1A and includes suitable transparent materials such as glass, quartz, ceramic, sapphire or plastic, etc., but the present disclosure is not limited thereto. The flexible substrate 20 is deformable to help the electronic device 1A being bent. The flexible substrate 20 includes suitable flexible materials, such as polycarbonate, polyimide, polypropylene or polyethylene terephthalate, etc. The first organic insulating layer 30 and the second organic insulating layer 70 are used to insulate the first conductive layer 40A, the second conductive layer 50A and other elements from external environment, or used to distribute the stress created while being bent. Furthermore, the first organic insulating layer 30 and the second organic insulating layer 70 may include suitable organic materials. The thickness of the first organic insulating layer 30 may be, for example, greater than or equal to 0.5 μm, and less than or equal to 2 μm; and the thickness of the second organic insulating layer 70 may be, for example, greater than or equal to 1 μm, and less than or equal to 9 μm. However, the ranges are merely examples, and the thickness of the first organic insulating layer 30 and the second organic insulating layer 70 are not limited thereto.

The materials of the first conductive layer 40A and the second conductive layer 50A may include suitable conductive materials, such as conductive metal materials or conductive transparent materials, but the present disclosure is not limited thereto. The metal materials may include suitable metals, such as Cu, Al, Mo, W, Au, Cr, Ni, Pt, Ti, Cu alloy, Al alloy, Mo alloy, W alloy, Au alloy, Cr alloy, Ni alloy, Pt alloy, Ti alloy or the combination thereof, but the present disclosure is not limited thereto. The transparent conductive material may include, for example, indium tin oxide (ITO), indium gallium zinc oxide (IGZO), a combination thereof, other good conductive materials or low resistance materials, but the present disclosure is not limited thereto.

In some embodiments, the first conductive layer 40A or the second conductive layer 50A may be manufactured using the same photomask or made of the same material as one of the layers of the active driving devices (e.g. switching transistor or driving transistor) or conductive pads. For example, the first conductive layer 40A and a source or drain uses the same photomask, and the second conductive layer 50A and a conductive pad uses the same photomask to reduce manufacturing costs, but the present disclosure is not limited thereto. In some embodiments, neither the first conductive layer 40A nor the second conductive layer 50A uses the same photomask as the elements in the display area 2, nor are they manufactured with same materials to the elements in the display area 2. In some embodiments, either the first conductive layer 40A or the second conductive layer 50A is electrically connected to the active driving devices in the display area 2 or in the non-display area 3. In some embodiments, either the first conductive layer 40A or the second conductive layer 50A is electrically connected to the wiring W on the wiring layer 5. In some embodiments, the self-illuminating display media (not shown) of the electronic device 1A, such as an LED, is electrically connected to a drain through, for example, a conductive pad or another conductive medium. In some embodiments, the self-illuminating display media or the media for controlling conductance (not shown) of the electronic device 1A, such as liquid crystal, is controlled by the drain or controlled by an electrode electrically connected to the drain.

The thickness of the first conductive layer 40A and the second conductive layer 50A may be, for example, greater than or equal to 0.4 μm, and less than or equal to 0.7 μm. The inorganic insulating layer 80 may include suitable insulating materials, such as an inorganic insulating material (e.g. $SiO_x$, $SiN_x$, $SiO_xN_y$, etc.) having a higher stiffness than the flexible substrate 20, but the present disclosure is not limited thereto. In some embodiments, the stiffness comparison is based on the Young's modulus of the materials.

In FIG. 3A, the resilient elements 61A are separated from each other for a distance rather than formed continuously. The distances between two adjacent resilient elements 61A may be identical or different, and is not limited thereto in the present disclosure. The first conductive layer 40A contacts the second conductive layer 50A at intervals, and the first conductive layer 40A may contact the second conductive layer 50A directly or indirectly, as long as the first conductive layer 40A and the second conductive layer 50A are electrically connected with each other at intervals. The way how the first conductive layer 40A and the second conductive layer 50A contacting with each other may be applied to any embodiment of the present disclosure. It should be noted that each of the resilient elements 61. A have a shape like a polygon, as shown in FIG. 3A. In other words, the parts where the first conductive layer 40A and the second conductive layer 50A contact the resilient elements 61A are several bent segments. Furthermore, the first conductive layer 40A contacts the second conductive layer 50A and the resilient elements 61A alternately to bend these structures. The thickness of the resilient structure 60A may be, for example, greater than or equal to 1 μm, and less than or equal to 4 μm, such as 2 μm or 3 μm.

The angle θ1 formed between the flexible substrate 20 to the interface 30A or the interface 30B, which are the interfaces formed between the first organic insulating layer 30 and the inorganic insulating layer 80, may be, for example, greater than 90 degrees and less than 180 degrees. As a result, the first organic insulating layer 30 may be smoothly connected to the inorganic insulating layer 80 to reduce the stress here. Therefore, the stripping happened between the first organic insulating layer 30 and the inorganic insulating layer 80, which is caused by large stress, may be prevented.

It should be noted that in FIG. 3A, the supporting substrate 10 is separated as two portions by the opening 12, the first conductive layer 40A extends across the opening 12, and two ends of the first conductive layer 40A are disposed on the two portions of the supporting substrate 10. Furthermore, the second conductive layer 50A extends across the opening 12, and two ends of the second conductive layer 50A are disposed on the two portions of the supporting substrate 10. As a result, it can be ensured that both of the first conductive layer 40A and the second conductive layer 50A extend across the part where the bending area 4 is bent. As a result, even if one of the first conductive layer 40A or the second conductive layer 50A is fractured because of being bent during usage, another one of the first conductive layer 40A or the second conductive layer 50A can keep transporting electrical signal to enhance the reliability of the electronic device 1.

Figure 3B:
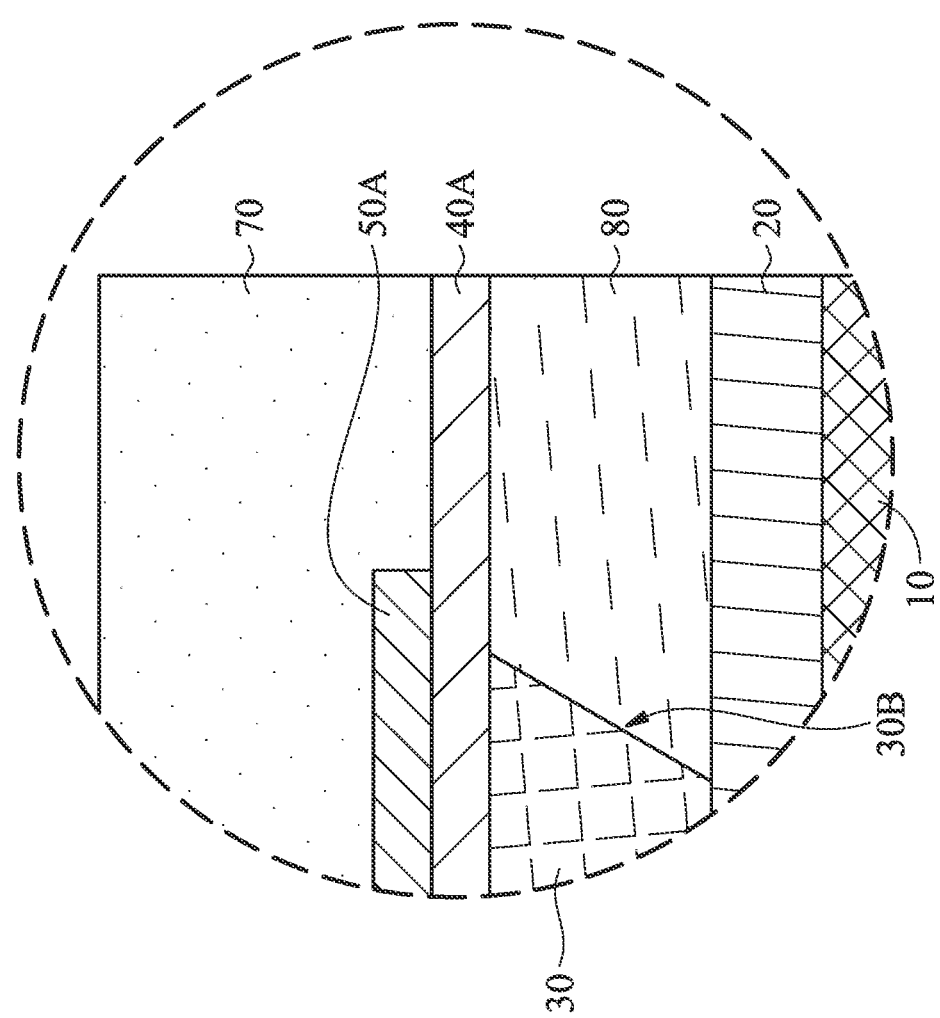
FIG. 3B is an enlarged view of an area indicated by a dashed line in FIG. 3A.

FIG. 3B is an enlarged view of an area indicated by a dashed line in FIG. 3A. It should be noted that at least a portion of the second conductive layer 50A overlaps a portion of the inorganic insulating layer 80 when viewed along a direction perpendicular to a surface of the flexible substrate 20. As a result, the area where the second conductive layer 50A overlaps the inorganic insulating layer 80 may be increased by this configuration so as to distribute the stress here, and the fracture happens during bending may be prevented by preventing the stress from being too concentrated.

Figure 3C:
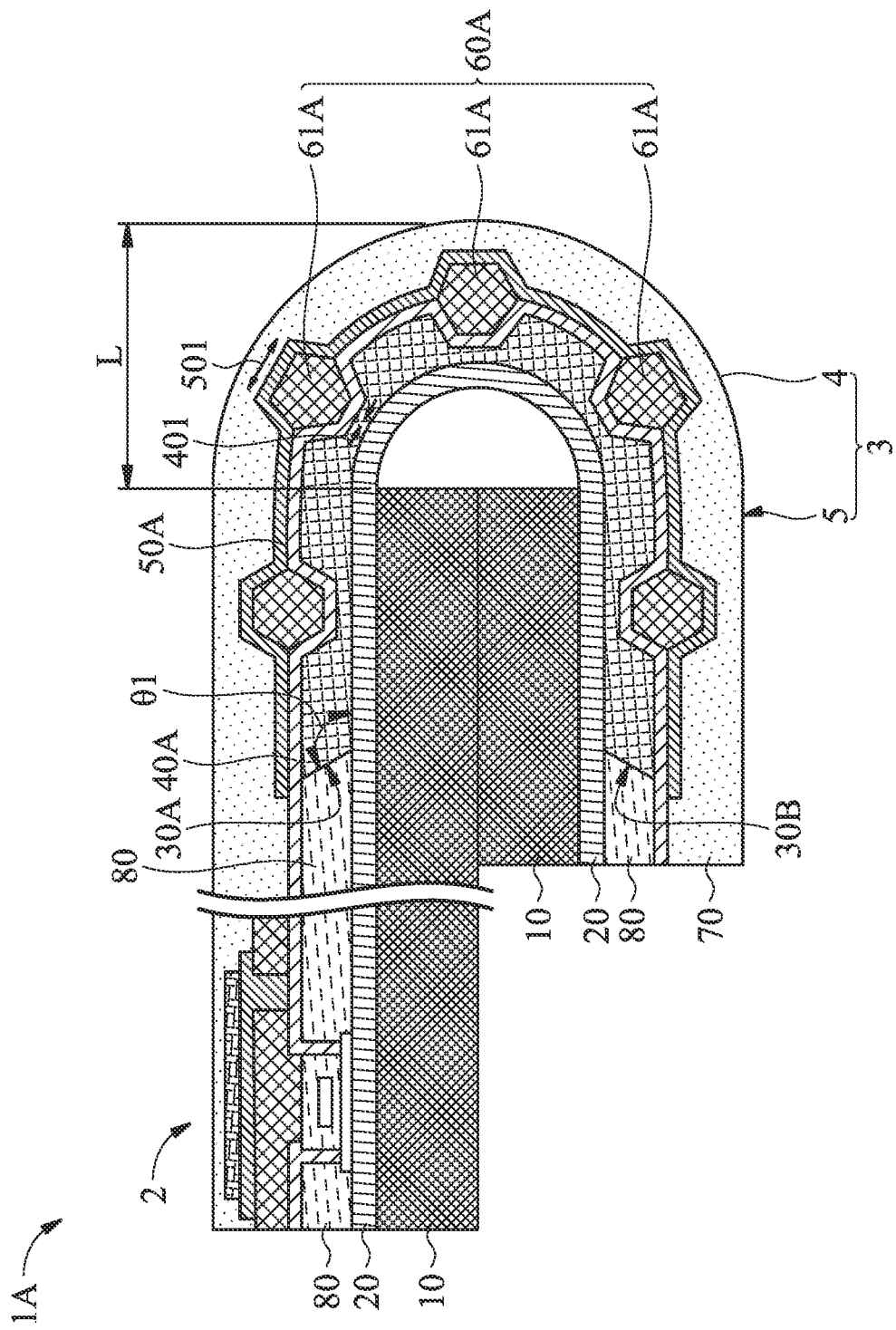
FIG. 3C is a cross-sectional view of the electronic device in FIG. 3A while being bent in the same way as in FIG. 2A.

FIG. 3C is a cross-sectional view of the electronic device 1A in FIG. 3A while being bent in the same way as in FIG. 2A. The bending area 4 in FIG. 2A has an arc-liked shape, and the thickness L of the bending area 4 may be, for example but not limited to, greater than or equal to 100 μm, and less than or equal to 500 μm, such as 100 μm, 250 μm or 400 μm. In FIG. 3C, when comparing with the situation in FIG. 3A which the electronic device 1A is not bent, the first conductive layer 40A is compressed to increase the angle between each of the adjacent segments of the first conductive layer 40A, and the second conductive layer 50A is stretched to decrease the angle between each of the adjacent segments of the second conductive layer 50A, so the resilient structure 60A may be deformed, as indicated by arrows 401 and arrows 501. As a result, the stress created when the bending area 4 of the electronic device 1A is bent may be distributed, the wiring area 5 may be hided at the back side of the display area 2, or the freedom of wiring may be increased, so as to be a means for producing an electronic device having a narrow frame or a combined electronic device with a narrow gap.

Figure 3D:
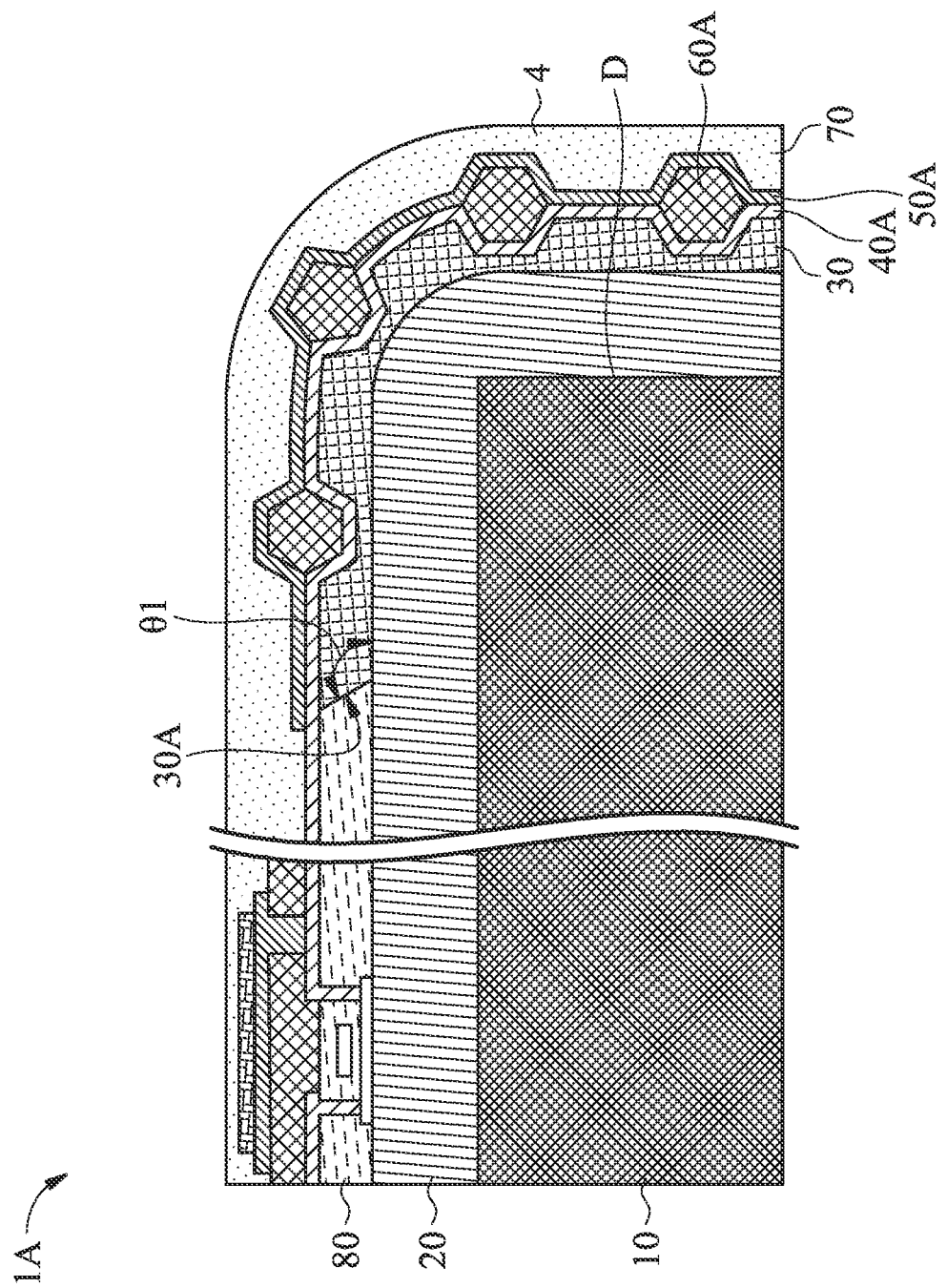
FIG. 3D is a cross-sectional view of the electronic device in FIG. 3A while being bent in the same way as in FIG. 2B.

FIG. 3D is a cross-sectional view of the electronic device 1A in FIG. 3A while being bent in the same way as in FIG. 2B. It should be noted that the ratios of the sizes between the elements in FIG. 3D are different from the former figures for convenience. In FIG. 3D, when comparing with the situation in FIG. 3B which the electronic device 1A is not bent, the first conductive layer 40A is compressed to increase the angle between each of the adjacent segments of the first conductive layer 40A, and the second conductive layer 50A is stretched to decrease the angle between each of the adjacent segments of the second conductive layer 50A, so the resilient structure 60A may be deformed. Furthermore, at the interface D, the flexible substrate 20 exposed by the opening 12 comes closer to or contacts with the supporting substrate 10 during the bending condition shown in FIG. 3D. As a result, while the bending area 4 of the electronic device 1A is bent, the wiring area 5 may be hided at the back side of the display area 2, or the freedom of wiring may be increased, so as to be a means for producing an electronic device having a narrow frame or a combined electronic device with a narrow gap.

Figure 4A:
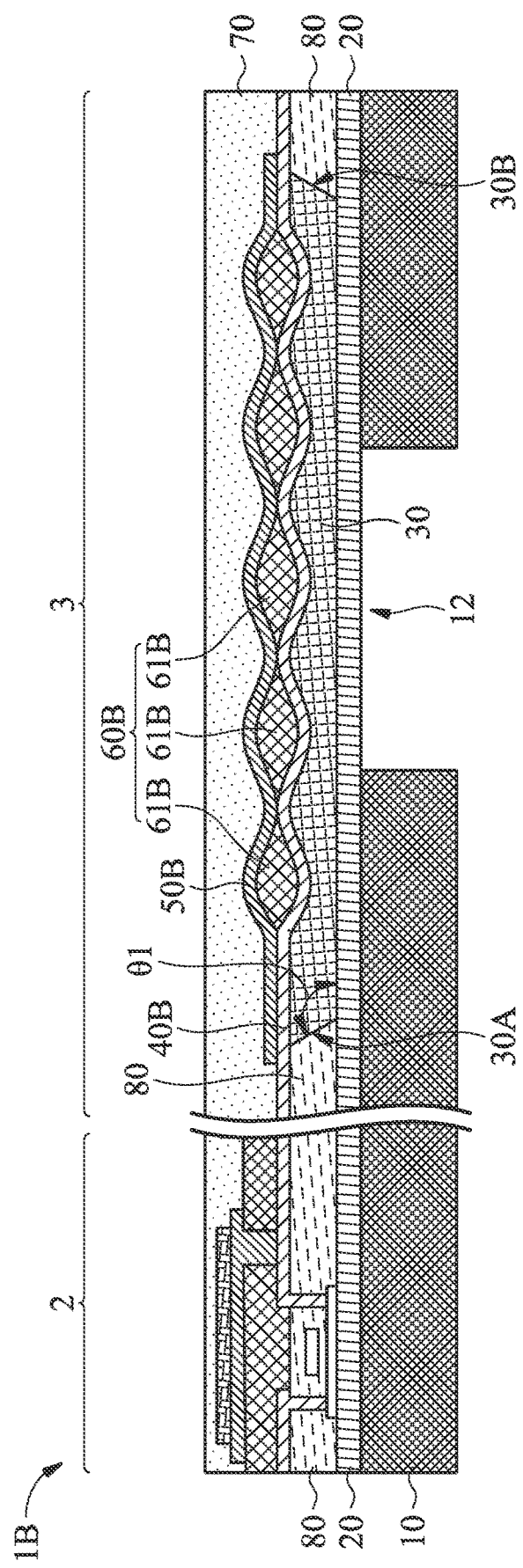
FIG. 4A is a cross-sectional view of an electronic device according to another embodiment of the present disclosure.

FIG. 4A is a cross-sectional view of an electronic device 1B according to another embodiment of the present disclosure. In FIG. 4A, the electronic device 1B includes a supporting substrate 10, a flexible substrate 20, a first organic insulating layer 30, a first conductive layer 40B, a second conductive layer 50B, a resilient structure 60B, a second organic insulating layer 70 and an inorganic insulating layer 80.

The flexible substrate 20 is disposed on the supporting substrate 10. At the non-display area 3, the supporting substrate 10 is separated by the opening 12 as two portions, and some of the flexible substrate 20 is exposed by the opening 12. The first organic insulating layer 30 and the inorganic insulating layer 80 are disposed on the flexible substrate 20, and the thickness of the first organic insulating layer 30 is substantially identical to the thickness of the inorganic insulating layer 80. The angle between the interface 30A or the interface 30B to the flexible substrate 20 is θ1, wherein the interface 30A or the interface 30B are interfaces formed between the first organic insulating layer 30 and the inorganic insulating layer 80. In some embodiments, the angle θ1 is greater than 90 degrees and less than 180 degrees.

The first conductive layer 40B is disposed on the first organic insulating layer 30 and the inorganic insulating layer 80, and the second conductive layer 50B is disposed on the first conductive layer 40B. The resilient structure 60B includes a plurality of resilient elements 61B disposed between the first conductive layer 40B and the second conductive layer 50B, and the second organic insulating layer 70 is disposed on the second conductive layer 50B. The first organic insulating layer 30, the first conductive layer 40B, the second conductive layer 50B, the resilient structure 60B and the second organic insulating layer 70 are disposed in the non-display area 3.

In this embodiment, the materials of the supporting substrate 10, the flexible substrate 20, the first organic insulating layer 30, the first conductive layer 40B, the second conductive layer 50B, the resilient structure 60B, the second organic insulating layer 70 and the inorganic insulating layer 80 are identical or similar to the material of the supporting substrate 10, the flexible substrate 20, the first organic insulating layer 30, the first conductive layer 40A, the second conductive layer 50A, the resilient structure 60A, the second organic insulating layer 70 and the inorganic insulating layer 80, respectively, and are not repeated.

In FIG. 4A, there is a distance between each of the resilient elements 61B rather than forming the resilient elements 61B continuously. The distance between two adjacent resilient elements 61B may be identical or different. The first conductive layer 40B contacts the second conductive layer 50B at intervals, wherein the first conductive layer 40B may directly contact the second conductive layer 50B at intervals, or conductive elements may be disposed between the first conductive layer 40B and the second conductive layer 50B to allow the first conductive layer 40B indirectly contacts the second conductive layer 50B at intervals. Furthermore, the first conductive layer 40B contacts the second conductive layer 50B and the resilient elements 61B alternately to bend these structures. It is different from the embodiment shown in FIG. 3A that the sides where the resilient elements 61B contact the first conductive layer 40B and the second conductive layer 50B have an arc-liked shape. In other words, the first conductive layer 40B and the second conductive layer 50B are disposed on the resilient elements 61B smoothly and have a wavy shape instead of being bent as several segments. In this embodiment, the first organic insulating 30 and the resilient elements 61B having arc-shaped sides may be made by using a multi-tone mask, such as half tone mask or gray tone mask. However, the present disclosure is not limited thereto.

Figure 4B:
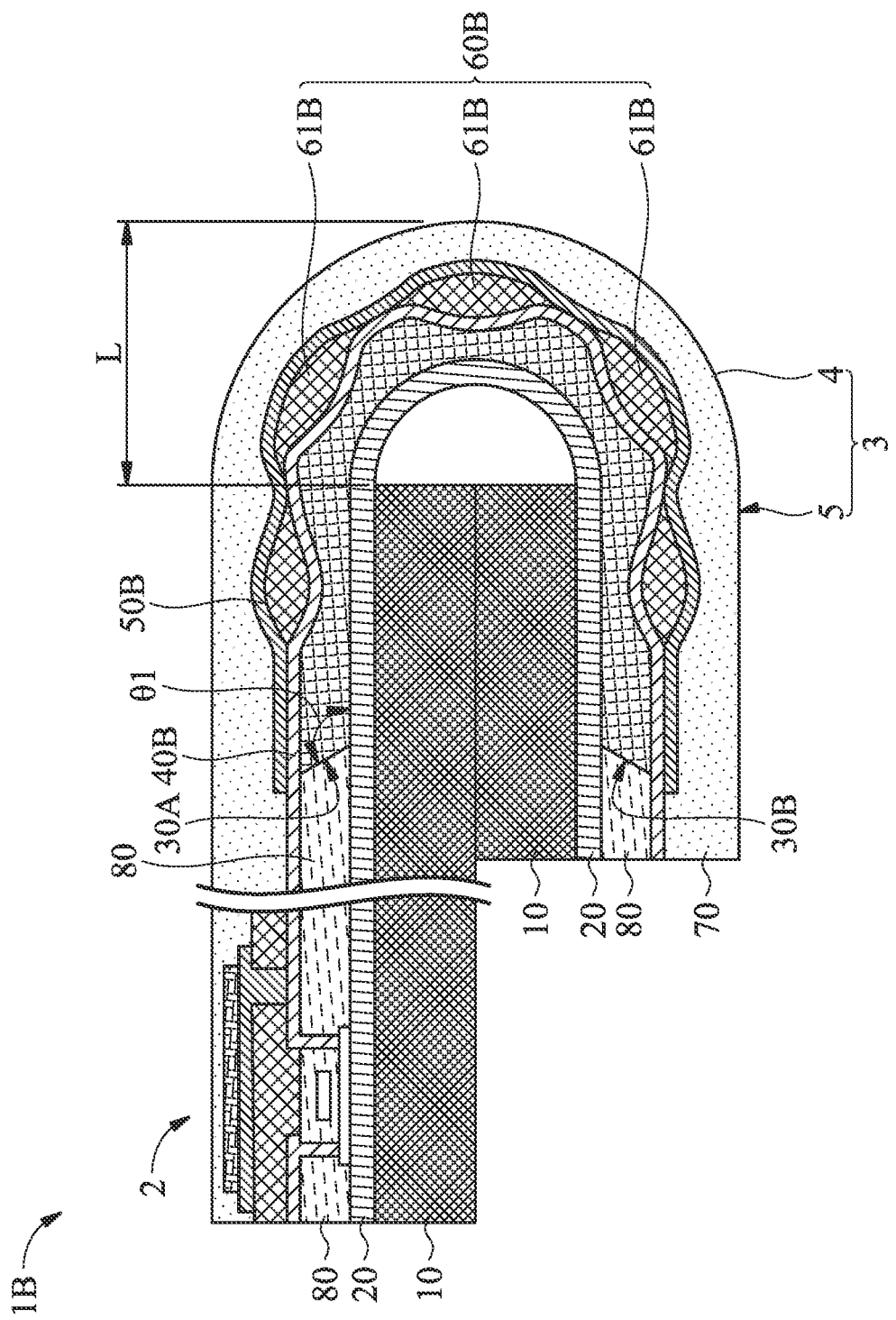
FIG. 4B is a cross-sectional view of the electronic device in FIG. 4A while being bent in the same way as in FIG. 2A.

FIG. 4B is a schematic view of the electronic device 1B while being bent in the same way as in FIG. 2A. In FIG. 4B, the bending area 4 has an arc-liked shape, and the thickness L of the bending area 4 is greater than or equal to 100 μm and less than or equal to 500 μm, such as 100 μm, 250 μm or 400 μm. Similar to the embodiment shown in FIG. 3C, the first conductive layer 40B is compressed and the second conductive layer 50B is stretched, so the resilient structure 60B may be deformed. As a result, while the bending area 4 of the electronic device 1B is bent, the wiring area 5 may be hided at the back side of the display area 2, or the freedom of wiring may be increased, so as to be a means for producing an electronic device having a narrow frame or a combined electronic device with a narrow gap.

Figure 4C:
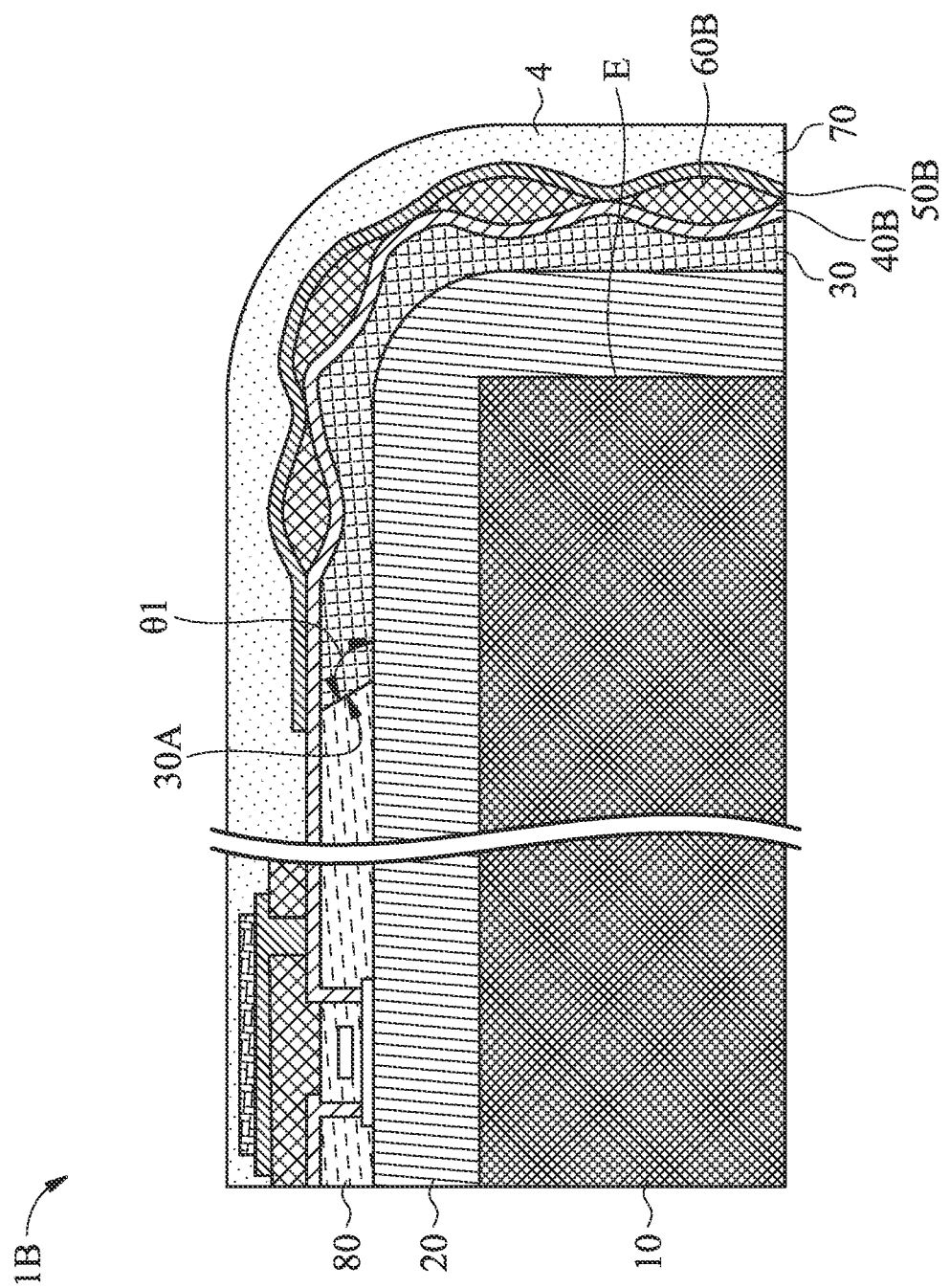
FIG. 4C is a cross-sectional view of the electronic device in FIG. 4A while being bent in the same way as in FIG. 2B.

FIG. 4C is a cross-sectional view of the electronic device 1B while being bent in the same way as in FIG. 2B. It should be noted that the ratios of the sizes between the elements in FIG. 4C are different from the former figures for convenience. In FIG. 4C, when comparing with FIG. 4A which the electronic device 1A is not bent, the first conductive layer 40B is compressed, and the second conductive layer 50B is stretched, so the resilient structure 60B may be deformed. Furthermore, at the interface E, the flexible substrate 20 exposed by the opening 12 comes closer to or contacts with the supporting substrate 10 during the bending condition shown in FIG. 4C. As a result, while the bending area 4 of the electronic device 1B is bent, the wiring area 5 may be hided at the back side of the display area 2, or the freedom of wiring may be increased, so as to be a means for producing an electronic device having a narrow frame or a combined electronic device with a narrow gap.

Figure 5C:
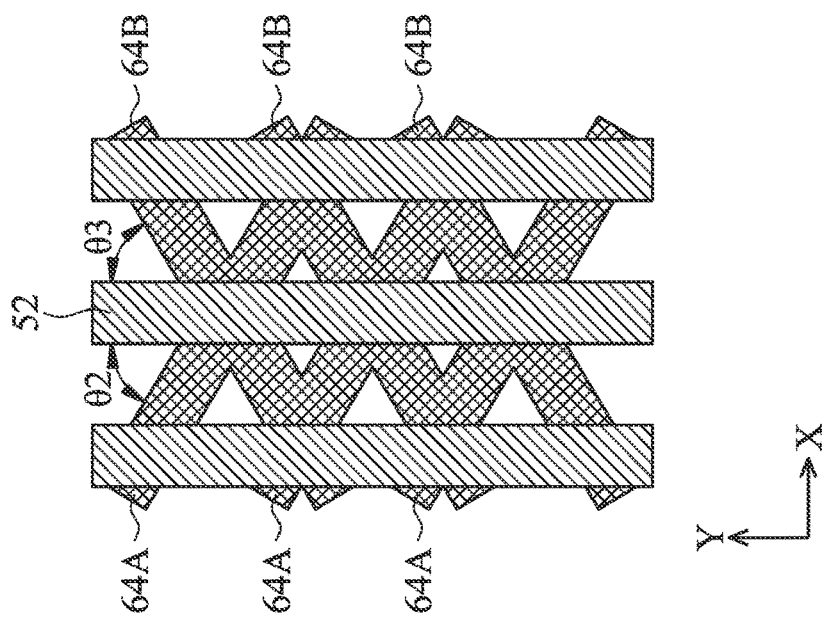
FIGS. 5A-5C are schematic views showing the position relationships between conductive structures and resilient elements according to some embodiments of the present disclosure.
Figure 5B:
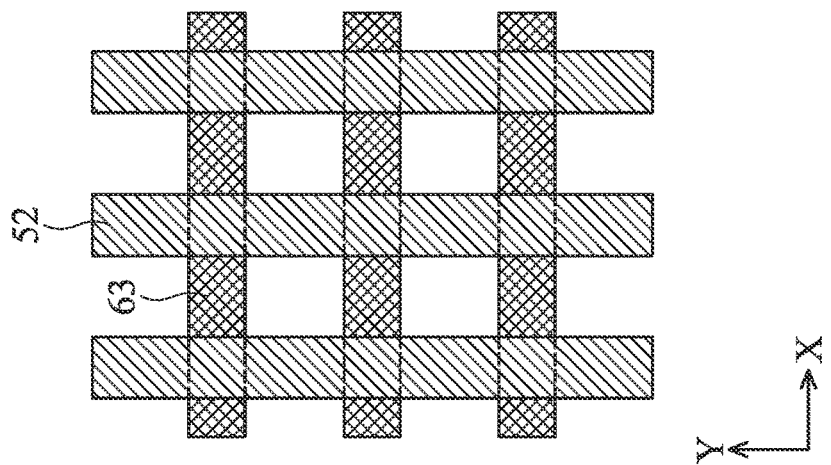
Figure 5A:
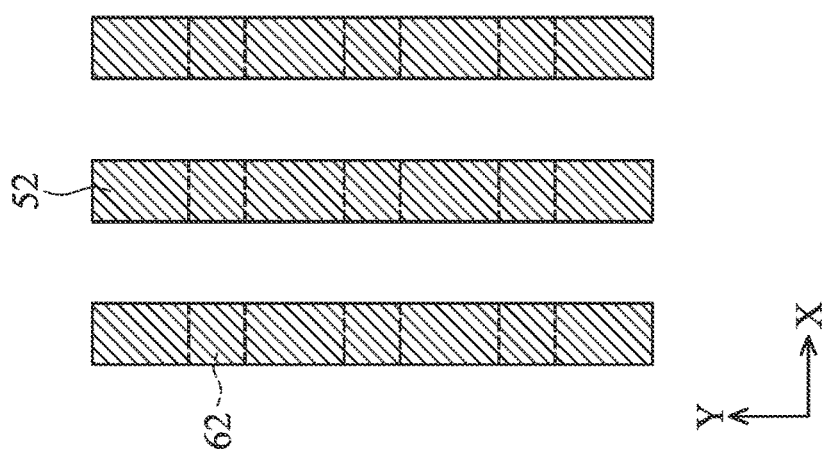

FIGS. 5A to 5C are schematic views of the position relationship between the second conductive layer 50A (or the second conductive layer 50B) to the resilient elements 61A (or the resilient elements 61B) of the bending area 4 when viewed along a normal direction to the surface of the flexible substrate 20. Hereinafter, the resilient elements 61A and the resilient elements 61B are described as resilient elements 62, resilient elements 63, first resilient elements 64A and second resilient elements 64B in different embodiments. It should be noted that the first conductive layer 40A or the first conductive layer 40B overlaps the second conductive layer 50A or the second conductive layer 50B in top view, respectively, so the first conductive layer 40A or the first conductive layer 40B is not illustrated.

In FIG. 5A, the second conductive layer 50A or the second conductive layer 50B includes a plurality of conductive strips 52 extended along the Y direction and parallel with each other. In the present disclosure, the display area 2, the bending area 4 and the wiring area 5 are arranged along the Y direction. In this embodiment, each of the resilient elements 62 has an island-liked shape, wherein there are a plurality of resilient elements 62 disposed under each of the conductive strips 52 at interval. The resilient elements 62 on different conductive strips 52 are arranged along the X direction to increase the symmetries of the stress along different directions. As a result, the possibility of the devices being damaged caused by the stress concentration on a direction due to asymmetry of the stresses may be reduced. In other embodiments, the resilient elements 62 on different conductive strips 52 may be not aligned along the X direction. In other embodiments, the amount of the resilient elements 62 on different conductive strips 52 may be different. Furthermore, although the width of the resilient elements 62 along the X direction is illustrated as identical to the width of the conductive strips 52 along the X direction, the present disclosure is not limited thereto. For example, depending on design requirement, the dimension of the resilient elements 62 may be adjusted to allow the width of the resilient elements 62 along the X direction being greater than or less than the width of the conductive strips 52 along the X direction to increase the freedom of processes.

In FIG. 5B, the second conductive layer 50A or the second conductive layer 50B includes a plurality of conductive strips 52 extended along the Y direction and parallel with each other. In this embodiment, each of the resilient elements 63 is strip-shaped, extends toward the X direction and passes under a plurality of conductive strips 32. In other words, each of the resilient elements 63 passes through multiple conductive strips 52, wherein the X direction is substantially perpendicular to the Y direction. The resilient elements 63 are substantially parallel to each other to increase the symmetries of the stress along different directions. As a result, the possibility of the devices being damaged caused by the stress concentration due to asymmetry of the stresses may be reduced. In other embodiments, the resilient elements 63 may be not parallel to each other.

In FIG. 5C, the second conductive layer 50A or the second conductive layer 50B includes a plurality of conductive strips 52 extended along the Y direction and parallel to each other. In this embodiment, the resilient structure has a mesh-liked shape and includes a plurality first strip structures 64A and a plurality of second strip structures 64B, wherein the first strip structures 64A and the second strip structures 64B intersect at a plurality of intersections, and the intersections overlap the conductive strips 52. Although the resilient structure in this embodiment is illustrated as having different first strip structures 64A and second strip structures 64B for convenience, the actual first strip structures 64A and the second strip structures 64B are formed integrally and disposed on the same plane. An angle θ2 is formed between the first strip structure 64A and the conductive strip an angle θ3 is formed between the second strip structure 64B and the conductive strip 52, and the angle θ2 and the angle θ3 are substantially identical. In other words, the first strip structure 64A and the second strip structure 64B are symmetrical relative to the conductive strip 52 to increase the symmetries of the stress along different directions. As a result, the possibility of the devices being damaged caused by the stress concentration due to asymmetry of the stresses may be reduced. In other embodiments, the angle θ2 may be different than the angle θ3.

Figure 6:
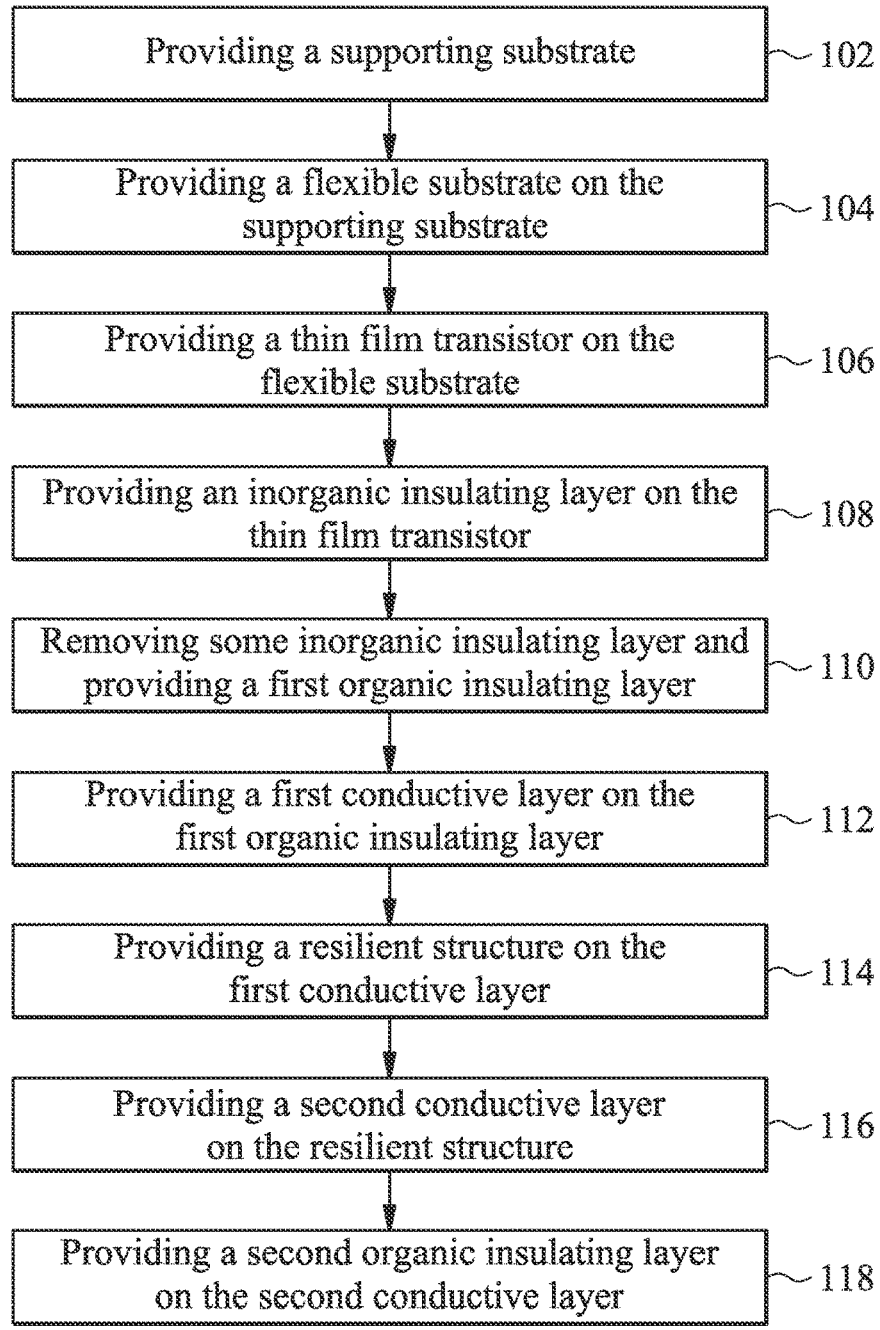
FIG. 6 is a flow diagram of manufacturing the electronic device according to some embodiments of the present disclosure.

FIG. 6 is a flow diagram 100 of manufacturing the electronic device according to some embodiments of the present disclosure. In step 102, a supporting substrate is provided. In step 104, a flexible substrate is provided on the supporting substrate. In step 106, a thin-film transistor (TFT) may be provided on the flexible substrate. For example, the thin-film transistor may be a semiconductor layer (e.g. amorphous silicon or low temperature poly-silicon (LIPS)), a top gate, bottom gate or double gate thin film transistor formed by metal oxide. In step 108, an inorganic insulating layer is provided on the thin-film transistor. In step 110, a portion of the inorganic insulating layer is removed through lithography process, and a first organic insulating layer is provided at where the inorganic insulating layer is removed. In step 112, a first conductive layer is provided on the first organic insulating layer. In step 114, a resilient structure is provided on the first conductive layer. In step 116, a second conductive layer is provided on the resilient structure. In step 118, a second organic insulating layer is provided on the second conductive layer.

In summary, a flexible electronic device is provided in the present disclosure. The structure of the flexible electronic device is flexible, which allows its wiring area being hidden at the back side of the display area, enhancing the freedom of wiring, and allows a greater display space, so as to be a means for producing an electronic device having a narrow frame or a combined electronic device with a narrow gap.

Furthermore, at least two conductive structures electrically connected with each other are formed in the bending area. As a result, even if one of the conductive structures is fractured because of being bent, another conductive structure can keep transporting electrical signal to increase the reliability of the electronic device.

Although embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope of such processes, machines, manufacture, and compositions of matter, means, methods, or steps. In addition, each claim constitutes a separate embodiment, and the combination of various claims and embodiments are within the scope of the disclosure.

What is claimed is:

1. An electronic device comprising a display area and a non-display area adjacent to the display area;
    a supporting substrate;
    a flexible substrate disposed on the supporting substrate;
    a first conductive layer disposed on the flexible substrate and disposed in both the display area and the non-display area;
    a second conductive layer disposed on the first conductive layer;
    a plurality of organic elements disposed between the first conductive layer and the second conductive layer in the non-display area;
    an opening passing through the supporting substrate and exposing a portion of the flexible substrate; and
    a first continuous organic insulating layer disposed on the first conductive layer and disposed in the display area, wherein the first continuous organic insulating layer and the plurality of organic elements are the same material layer;
    wherein the first conductive layer alternately contacts the second conductive layer and the plurality of organic elements.

2. The electronic device as claimed in claim 1, wherein the supporting substrate comprises a first portion and a second portion, the first portion has a first side, the second portion has a second side adjacent to the first side, and a distance between the first side and the second side is greater than a minimum distance between two of the plurality of the organic elements that are adjacent to each other.

3. The electronic device as claimed in claim 2, wherein the distance between the first side and the second side is greater than a maximum width of at least one of the plurality of the organic elements.

4. The electronic device as claimed in claim 2, wherein the minimum distance between the two of the plurality of the organic elements that are adjacent to each other is different from a maximum width of at least one of the plurality of the organic elements.

5. The electronic device as claimed in claim 1, wherein a maximum thickness of the supporting substrate is greater than a maximum thickness of the flexible substrate.

6. The electronic device as claimed in claim 1, wherein a maximum thickness of at least one of the plurality of the organic elements is greater than a maximum thickness of the first conductive layer.

7. The electronic device as claimed in claim 1, wherein a maximum thickness of at least one of the plurality of the organic elements is greater than a maximum thickness of the second conductive layer.

8. The electronic device as claimed in claim 1, wherein each of the plurality of organic elements has an arc-liked shape in a cross-sectional view.

9. The electronic device as claimed in claim 1, wherein a portion of the first conductive layer is between the plurality of organic elements.

10. The electronic device as claimed in claim 1, further comprising an inorganic insulating layer disposed between the flexible substrate and the first conductive layer, wherein the second conductive layer overlaps a portion of the inorganic insulating layer.

11. The electronic device as claimed in claim 1, further comprising:
    a conductive pad in the display area; and
    a electronic element in the display area;
    wherein the plurality of organic elements extends between the conductive pad and the electronic device in the display area.

* * * * *